United States Patent
Hsu et al.

(10) Patent No.: US 11,747,091 B2
(45) Date of Patent: Sep. 5, 2023

(54) FAST HEAT-SINKING DEVICE FOR EVAPORATORS

(71) Applicant: LDC Precision Engineering CO., Ltd., New Taipei (TW)

(72) Inventors: Chi-Feng Hsu, New Taipei (TW); Cheng-Jen Liang, New Taipei (TW); Chih-Wei Chen, New Taipei (TW)

(73) Assignee: LDC PRECISION ENGINEERING CO., LTD., New Taipei (TW)

( * ) Notice: Subject to any disclaimer, the term of this patent is extended or adjusted under 35 U.S.C. 154(b) by 68 days.

(21) Appl. No.: 17/324,094

(22) Filed: May 18, 2021

(65) Prior Publication Data

US 2021/0270538 A1    Sep. 2, 2021

Related U.S. Application Data

(63) Continuation-in-part of application No. 16/562,430, filed on Sep. 5, 2019, now Pat. No. 11,064,632.

(51) Int. Cl.
  *F28D 15/02* (2006.01)
  *H05K 7/20* (2006.01)
  *F28F 3/12* (2006.01)
  *F28F 3/02* (2006.01)

(52) U.S. Cl.
  CPC ............ *F28D 15/0275* (2013.01); *F28F 3/02* (2013.01); *F28F 3/12* (2013.01); *H05K 7/20309* (2013.01)

(58) Field of Classification Search
  CPC ............ F28D 15/0266; F28D 15/0275; F28D 2021/0028; F28F 3/02; F28F 3/027; F28F 3/12; F28F 3/04; F28F 3/025; H05K 7/20309; H05K 7/2029; H05K 7/20336; H05K 7/20218; H05K 7/20254; H01L 23/3672; H01L 23/427; H01L 23/473
  USPC .......................... 165/80.2, 80.3, 104.33, 185
  See application file for complete search history.

(56) References Cited

U.S. PATENT DOCUMENTS

| | | | |
|---|---|---|---|
| 6,672,379 B1 * | 1/2004 | Wang | F28F 3/02 257/722 |
| 2004/0159421 A1 * | 8/2004 | Wang | F28F 3/02 165/185 |
| 2007/0165382 A1 * | 7/2007 | Yu | H01L 23/4093 257/E23.086 |
| 2008/0105409 A1 * | 5/2008 | Luo | F28D 15/0266 257/E23.099 |

(Continued)

*Primary Examiner* — Len Tran
*Assistant Examiner* — Gustavo A Hincapie Serna
(74) *Attorney, Agent, or Firm* — Chun-Ming Shih; LANWAY IPR SERVICES

(57) ABSTRACT

A fast heat-sinking device for evaporators according to the present invention is disclosed, comprising at least one heat-sinking component which is formed by means of conjunctively assembling an outer wall board and an inner wall board; the interior of the outer wall board includes a semi-open first evaporation area; the interior of the inner wall board includes a semi-open second evaporation area, and the inner wall board is concavely configured with a gap; as such, the inner wall board is attached onto one side of the outer wall board thus further being assembled into the heat-sinking component, and the first evaporation area and the second evaporation area are connected in communication at the notch so as to together form an air concentration area, as a heat-sinking structure of the evaporator.

6 Claims, 18 Drawing Sheets

(56) References Cited

U.S. PATENT DOCUMENTS

| | | | | |
|---|---|---|---|---|
| 2009/0020279 A1* | 1/2009 | Horng | ............... | F28F 3/02 |
| | | | | 165/185 |
| 2011/0005726 A1* | 1/2011 | Zhang | ............... | H01L 23/467 |
| | | | | 228/183 |
| 2011/0308776 A1* | 12/2011 | Huang | ............... | H01L 23/3672 |
| | | | | 165/185 |
| 2013/0105132 A1* | 5/2013 | Huang | ............... | H01L 21/4882 |
| | | | | 165/185 |
| 2013/0180697 A1* | 7/2013 | Chen | ............... | H01L 21/4882 |
| | | | | 165/185 |
| 2013/0269920 A1* | 10/2013 | Taketomi | ............... | F28F 3/02 |
| | | | | 165/185 |
| 2014/0345830 A1* | 11/2014 | Jang | ............... | H01L 23/3672 |
| | | | | 165/104.21 |
| 2014/0369055 A1* | 12/2014 | Tsou | ............... | F21V 29/717 |
| | | | | 165/185 |
| 2019/0320551 A1* | 10/2019 | Kao | ............... | F28F 3/083 |
| 2019/0394903 A1* | 12/2019 | Chang | ............... | B21D 53/022 |
| 2020/0103181 A1* | 4/2020 | Liu | ............... | H01L 21/4878 |
| 2020/0217598 A1* | 7/2020 | Huang | ............... | G06F 1/20 |
| 2020/0271390 A1* | 8/2020 | Rice | ............... | F28F 3/027 |
| 2020/0296859 A1* | 9/2020 | Takagi | ............... | F25B 39/022 |

\* cited by examiner

FAST HEAT-SINKING DEVICE FOR EVAPORATORS

BACKGROUND OF THE INVENTION

1. Field of the Invention

The present invention relates to a fast heat-sinking device for evaporators which can be used as a heat dissipation structure capable of performing liquid/gas conversions in order to achieve the intended heat dissipation effect.

2. Description of Related Art

In recent years, the heat generation of electronic components has been increasing rapidly with the precision improvements of semiconductor processes. Therefore, how to enhance the heat-sinking capability of electronic components in order to maintain the normal operations of components has become a very important engineering issue.

Among currently existing technologies, the direct air-cooling technology that is widely applied can no longer meet the heat dissipation requirements of many electronic components featuring high heat flux, so that, in addition to such an air-cooling technology, it is also possible to use the liquid-gas conversion of water to achieve the objective of heat dissipation, in which, this type of technology provides two sets of heat spreaders and two sets of connected pipes, and one set of heat spreaders is used to evaporate to take away the absorbed heat, while the other set of heat spreaders is used to condense in order to cool down and return to the output cooling water for heat-sinking cycle In the circuit; it should be understood that the pressures in such two sets of heat spreaders are different, so the water can be automatically transported back and forth. However, the interior of the above-said heat spreaders mostly comprises a simple fin or flow channel design for enabling water circulation therein, which makes the internal liquid/gas conversion effectiveness of the water quite limited.

Therefore, in view of the design and improvement regarding to the internal flow channel structure, more space for water evaporation and air concentration has been added and the liquid-gas conversion efficiency has been improved; meanwhile, the structure composition has been enhanced and the multi-piece parts have been included and assembled thereby reducing the difficulty in component structure manufacturing processes and elevating the convenience and production efficiency of the assembly operations, which is the solution of the fast heat-sinking device for evaporators offered by the present invention.

SUMMARY OF THE INVENTION

A fast heat-sinking device for evaporators, comprising: at least one heat-sinking component which is formed by means of conjunctively assembling an outer wall board and an inner wall board; the outer wall board is separately installed with a first board, a second board and a third board, in which the second board is located on one side of the first board, the third board is located on the other side of the first board, and a preset angle is formed between the third board and the first board such that a semi-open first evaporation area is formed within the outer wall board; the inner wall board is installed with a fourth board, a fifth board and a sixth board, in which the fifth board is located on one side of the fourth board, the sixth board is located on the other side of the fourth board, and preset angles are respectively formed between the fifth and the sixth boards and the fourth board such that a semi-open second evaporation area is formed within the inner wall board, and a gap is concavely configured at the middle position of the fifth board along with the fourth board near the inner side; and, therefore, the inner wall board is attached to one side of the outer wall board thus allowing to be further assembled into a heat-sinking component, and the first evaporation area and the second evaporation area are connected in communication at the gap so as to further together form an air concentration area; in addition, a plurality of such heat-sinking components are continuously arranged, assembled or integrally manufactured towards the same direction to become a heat-sinking module so as to be installed inside an sealed outer case to act as a heat-sinking structure of the evaporator.

In a preferred embodiment, the outer wall board is manufactured by integrally forming or mutually connecting in fixation the first board, the second board and the third board, while the inner wall board is manufactured by integrally forming or mutually connecting in fixation the fourth board, the fifth board and the sixth board.

In a preferred embodiment, the positions of the two ends of the second board near the outer side are respectively configured with a notch, and the gap allows to respectively form a protrusion at the positions of the two ends of the fifth board along with the fourth board near the outer side, with each protrusion being installed within each notch so as to facilitate the tight and close attachment of the inner wall board onto one side of the outer wall board.

In a preferred embodiment, the outer wall board is openly configured with one or more first liquid slot on the side neighboring the third board and openly configured with an air slot on the side neighboring the second board, and the inner wall board is also openly configured with one or more second liquid slot on the side neighboring the sixth board, such that, when the inner wall board and the outer wall board are assembled to form the heat-sinking component, each first liquid slot and each second liquid slot can connectively communicate to create a channel enabling liquid circulation, while the air slot and the gap connectively communicate to create a channel enabling air circulation.

In a preferred embodiment, the outer wall board thickness of the outer wall board is equal to the inner wall board thickness of the inner wall board.

In a preferred embodiment, the evaporation area widths of the first evaporation area and the second evaporation area are 1~5 times of the outer wall board thickness of the outer wall board.

In a preferred embodiment, the minimum height at the gap concavely configured on the inner wall board is equal to 0.3~0.7 times of the total height of the outer wall board.

In a preferred embodiment, the upper end of the inner wall board is respectively formed with massive amounts of first bumps and second bumps, in which the first bumps are formed by extending the top end of the inner wall board towards a lateral side for a preset length, and the second bumps are formed by extending the top end of the inner wall board towards the other lateral side for a preset length, with each of the first bumps and each of the second bumps being mutually offset such that the top end of the inner wall board becomes continuously bow-shaped.

A fast heat-sinking device for evaporators, comprising: at least one heat-sinking component which is formed by means of conjunctively assembling an outer wall board and plural inner wall boards; the outer wall board is separately installed with a first board, a second board and a third board, in which the second board is located on one side of the first board, the third board is located on the other side of the first board, and a preset angle is formed between the third board and the first board such that a semi-open first evaporation area is formed within the outer wall board; the inner wall board is installed with a fourth board, a fifth board and a sixth board, in which the fifth board is located on one side of the fourth board, the sixth board is located on the other side of the fourth board, and preset angles are respectively formed between the fifth and the sixth boards and the fourth board such that a semi-open second evaporation area is formed within the inner wall board, and a gap is concavely configured at the middle position of the fifth board along with the fourth board near the inner side; and, therefore, each of the inner wall boards is attached to one side of the outer wall board thus allowing to be further assembled into a heat-sinking component, and the first evaporation area and the second evaporation area are connected in communication at the gap so as to further together form an air concentration area; in addition, a plurality of such heat-sinking components are continuously arranged, assembled or integrally manufactured towards the same direction to become a heat-sinking module so as to be installed inside an sealed outer case to act as a heat-sinking structure of the evaporator.

DETAILED DESCRIPTION OF THE PREFERRED EMBODIMENTS

Figure 1:
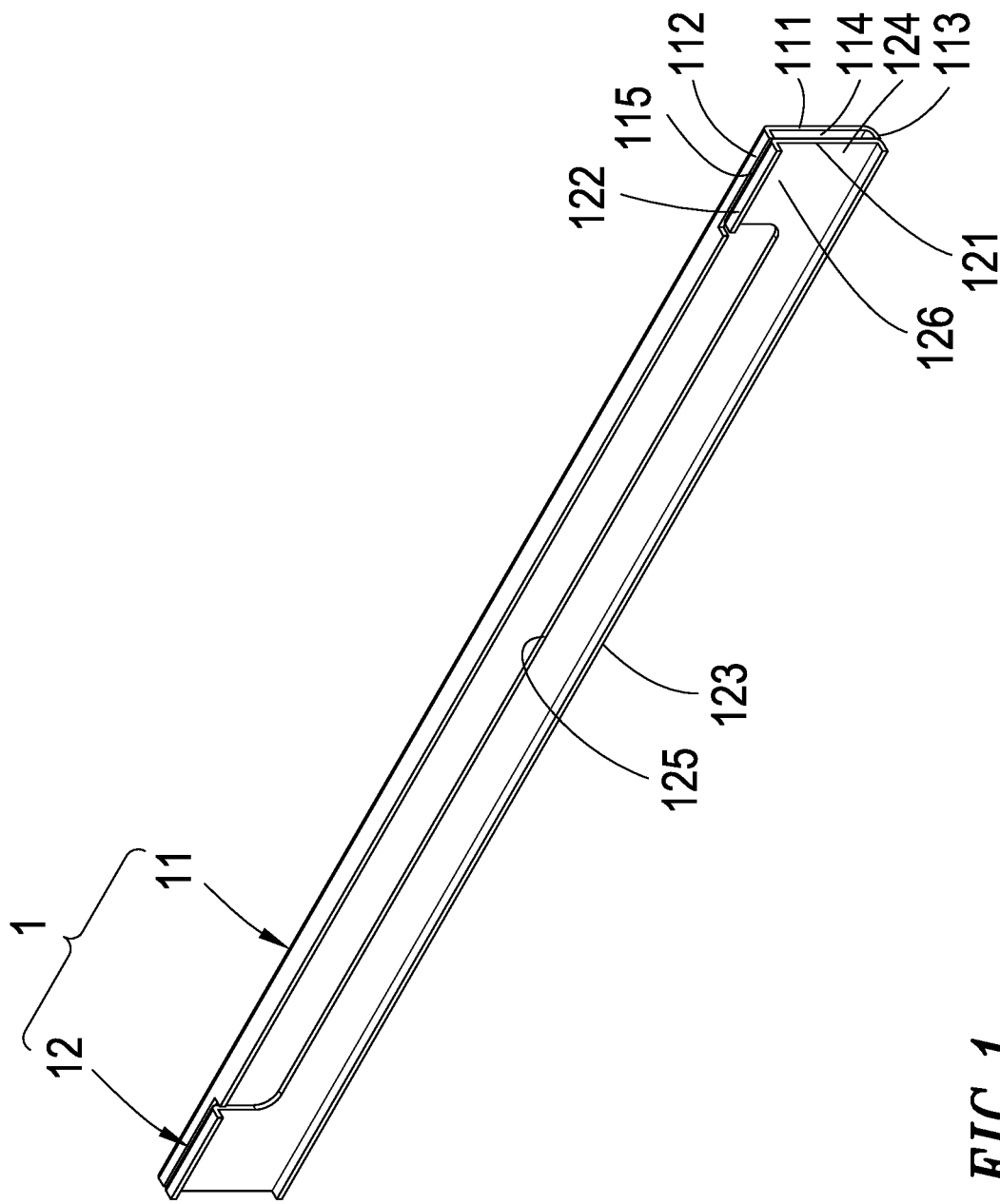
FIG. 1 shows a stereo assemblage view of the heat-sinking component in a first embodiment of the heat-sinking device according to the present invention.

Other technical contents, aspects and effects in relation to the present invention can be clearly appreciated through the detailed descriptions concerning the preferred embodiments of the present invention in conjunction with the appended drawings.

Refer first to FIGS. 1-4 concerning a first embodiment of the present invention, wherein a stereo view of the fast heat-sinking device for evaporators according to the present invention and a cross-sectioned view for the inner structure thereof are respectively shown, and it can be seen that the illustrated fast heat-sinking device for evaporators according to the present invention comprises a heat-sinking component which is conjunctively assembled by an outer wall board 11 and an inner wall board 12.

Herein it can be observed that the outer wall board 11 is manufactured by integrally forming or mutually connecting in fixation the first board 111, the second board 112 and the third board 113, the second board 112 is located on one side of the first board 111, the third board 113 is located on the other side of the first board 111, and a preset angle, e.g., 90° (which can be arbitrarily set within a range of 60°~120°), is respectively formed between the second board 112, third board 113 and the first board 111 such that a semi-open first evaporation area 114 is formed within the outer wall board 11, while the positions of the two ends of the second board 112 near the outer side are respectively configured with a notch 115.

In addition, the inner wall board 12 is manufactured by integrally forming or mutually connecting in fixation the fourth board 121, the fifth board 122 and the sixth board 123, the fifth board 122 is located on one side of the fourth board 121, the sixth board 123 is located on the other side of the fourth board 121, and a preset angle, e.g., 90° (which can be arbitrarily set within a range of 60°~120°), is respectively formed between the fifth board 122, sixth board 123 and the fourth board 121 such that a semi-open second evaporation area 124 is formed within the inner wall board 12, while a gap 125 is concavely configured at the middle position of the fifth board 122 along with the fourth board 121 near the inner side, so that the gap 125 allows to respectively form a protrusion at the positions of the two ends of the fifth board 122 along with the fourth board 121 near the outer side.

Each protrusion 126 is installed inside each notch 115 such that the inner wall board 12 can be attached to one side of the outer wall board 11 thus allowing to be further assembled into a heat-sinking component 1, and the first evaporation area 114 and the second evaporation area 124 are connected in communication at the gap 125 so as to further together form an air concentration area 13.

Besides, a plurality of heat-sinking components 1 can be continuously arranged, combined or integrally manufactured in the same direction thereby constituting a heat-sinking module 10 which can be installed and sealed within an outer case 2 so as to operate in conjunction with the heat dissipation structure in the evaporator of a condenser in practice.

Next, refer to FIGS. 5-8, in use, the inside of heat-sinking module 10 may contain a prescribed amount of water respectively located within the first evaporation area 114 and the second evaporation area 115, the rear section at the bottom plane of the outer case 2 can be fixedly locked with a heat source 3 (e.g., a CPU or other electronic products); also, heat-sinking fins 4 and a connection tube 5 can be installed on the outer case 2 together, and the connection tube 5 is further connected to a condenser 6 such that, when the heat source 3 starts to generate heat energy, the generated heat energy can be conducted into the inside of the outer case 2 and passed to the heat-sinking module 10 so that the water in the first evaporation area 114 and the second evaporation area 124 can be heated to evaporate, thus making the high-temperature air evaporated into a gaseous state concentrate into the air concentration area 13, and, further due to the influence of negative pressure, flowing into the condenser 6 by way of the connection tube 5; on the contrary, after the high-temperature air enters the condenser 6 to cool down, it becomes water again, and flows back to the heat-sinking module 10 through the connection tube 5.

Figure 2:
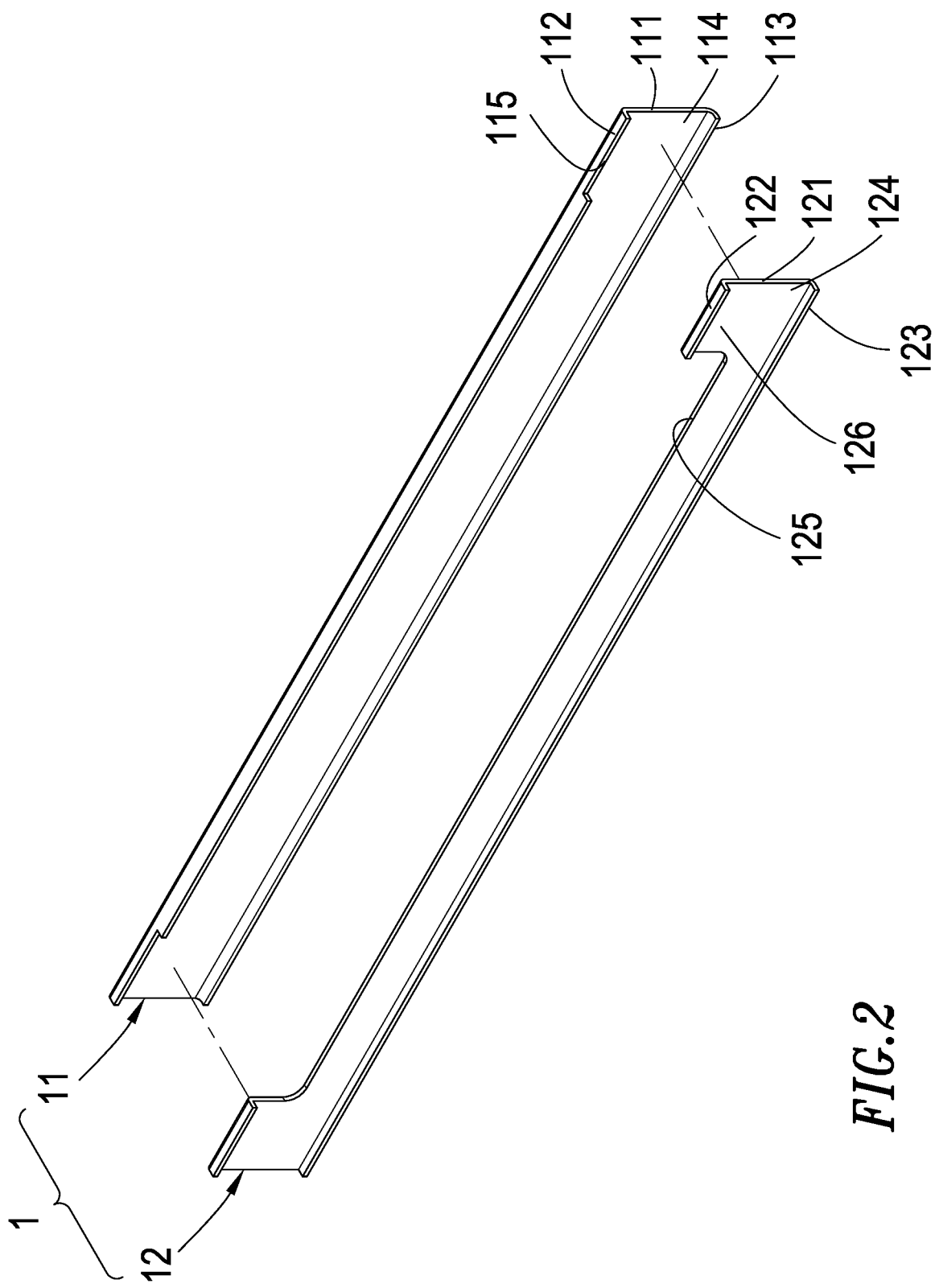
FIG. 2 shows a stereo disassemblage view of the heat-sinking component in the first embodiment of the heat-sinking device according to the present invention.
Figure 3:
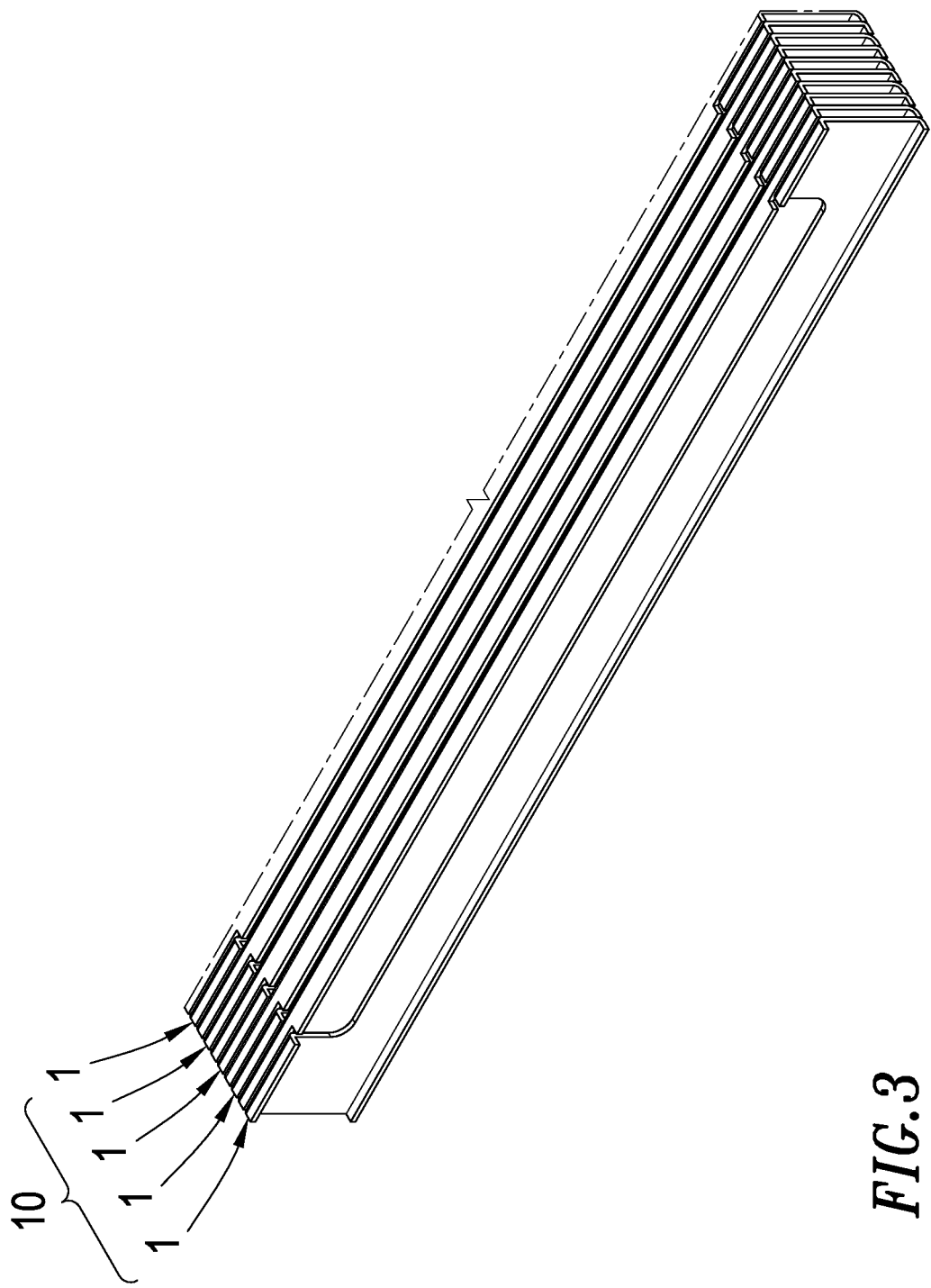
FIG. 3 shows a partial stereo assemblage view of the heat-sinking module in the first embodiment of the heat-sinking device according to the present invention.
Figure 4:
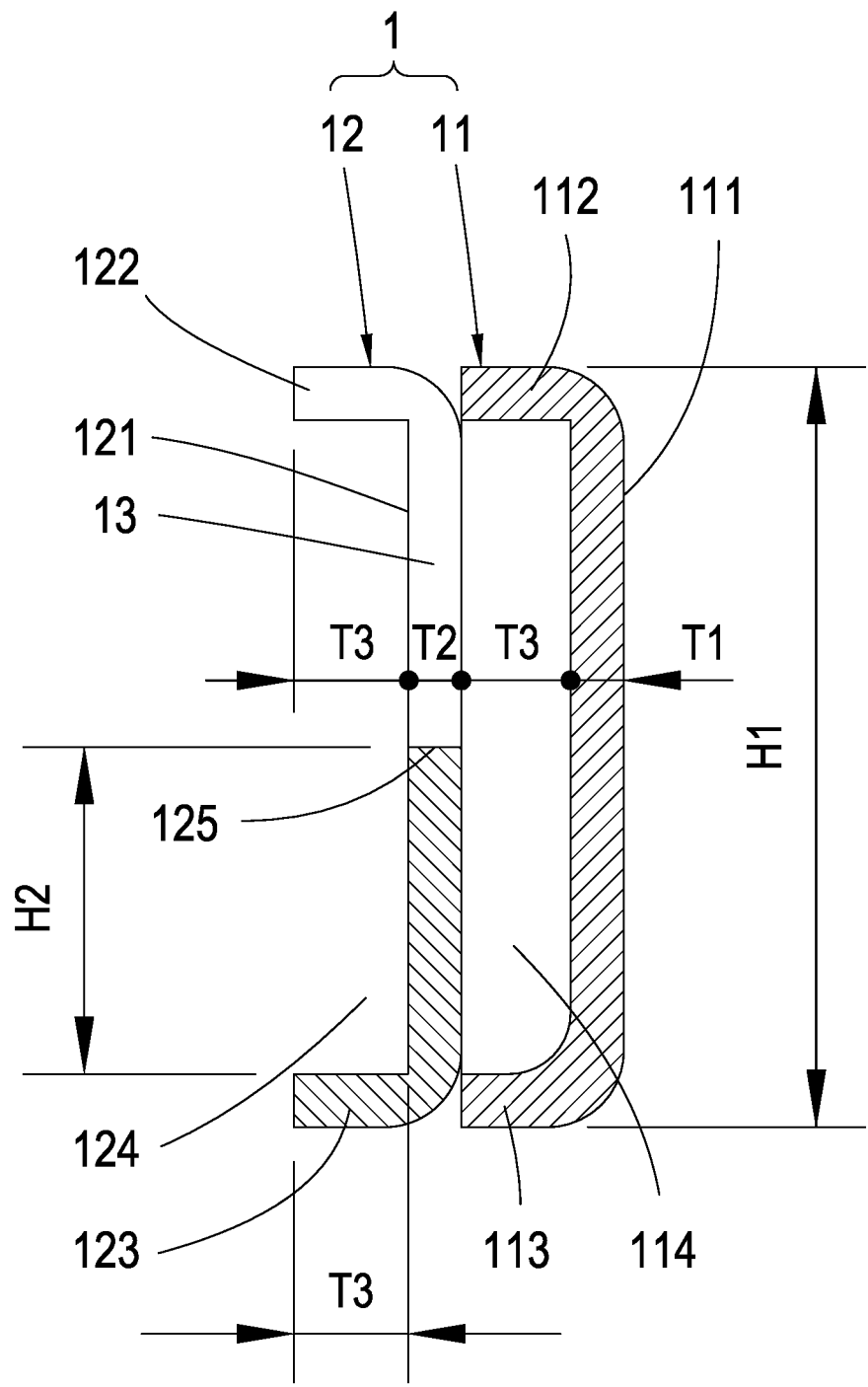
FIG. 4 shows a cross-sectioned view of the heat-sinking component in the first embodiment of the heat-sinking device according to the present invention.
Figure 5:
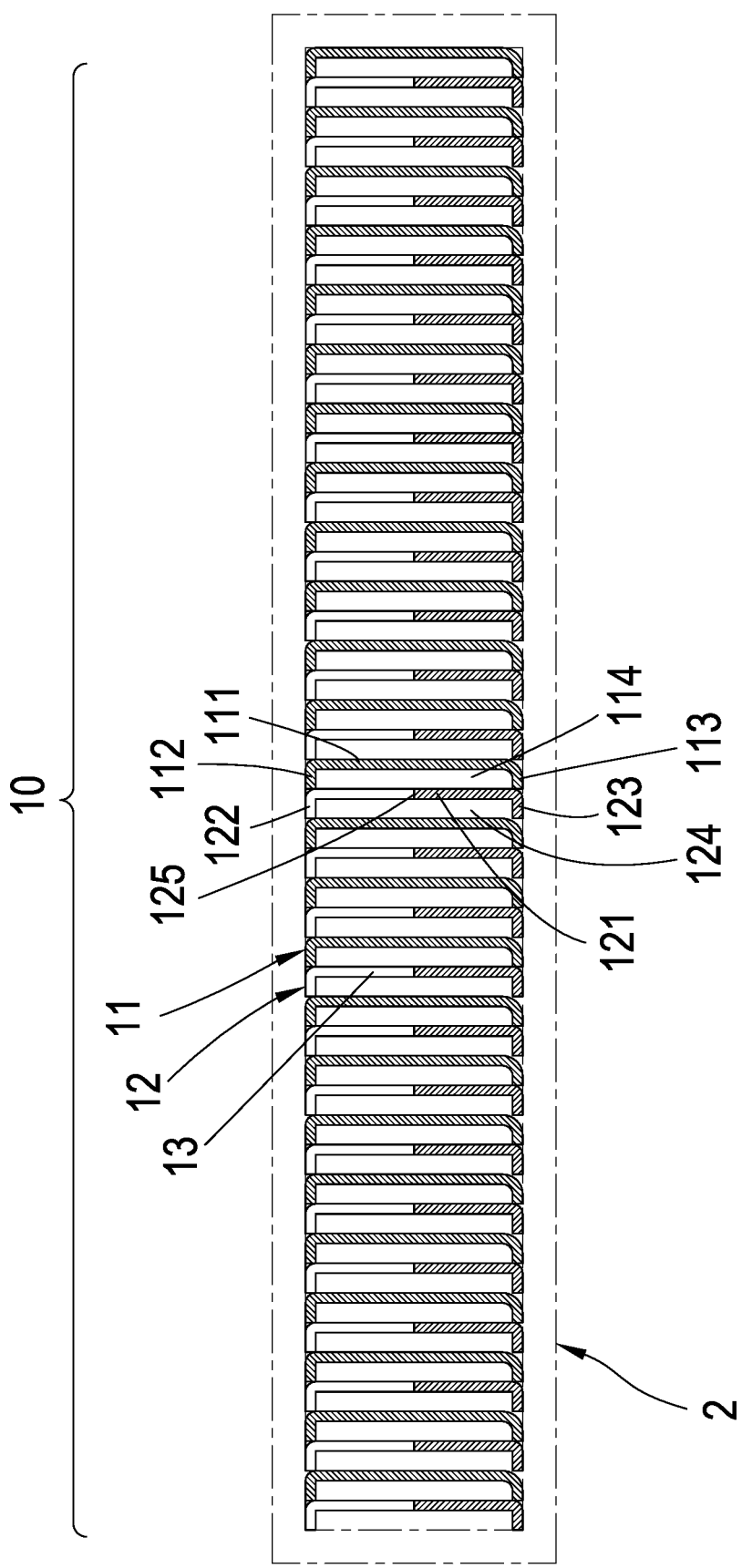
FIG. 5 shows a cross-sectioned view of the heat-sinking module in the first embodiment of the heat-sinking device according to the present invention.
Figure 6:
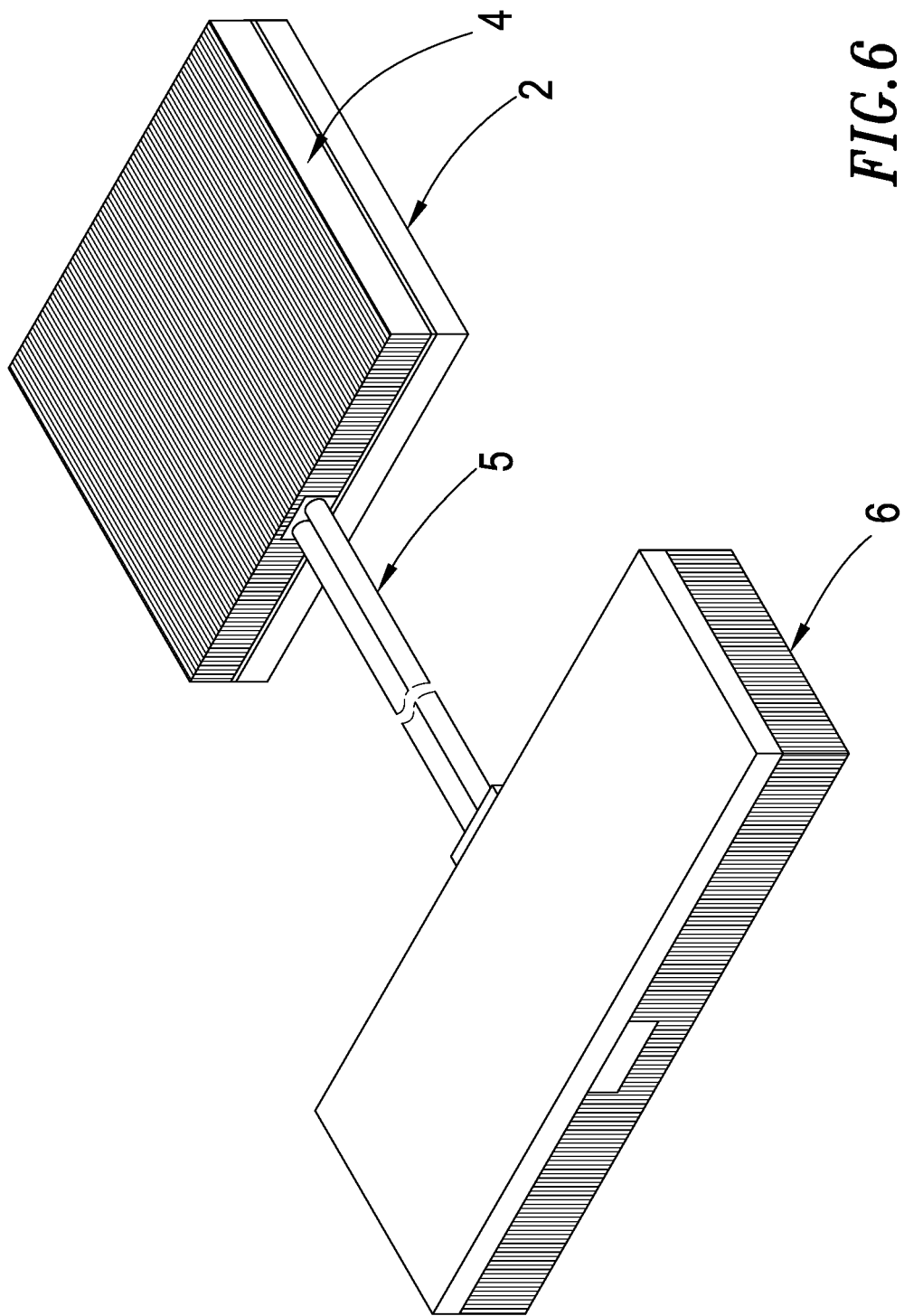
FIG. 6 shows a stereo view of the heat-sinking module combined with the use of a condenser in the first embodiment of the heat-sinking device according to the present invention.
Figure 7:
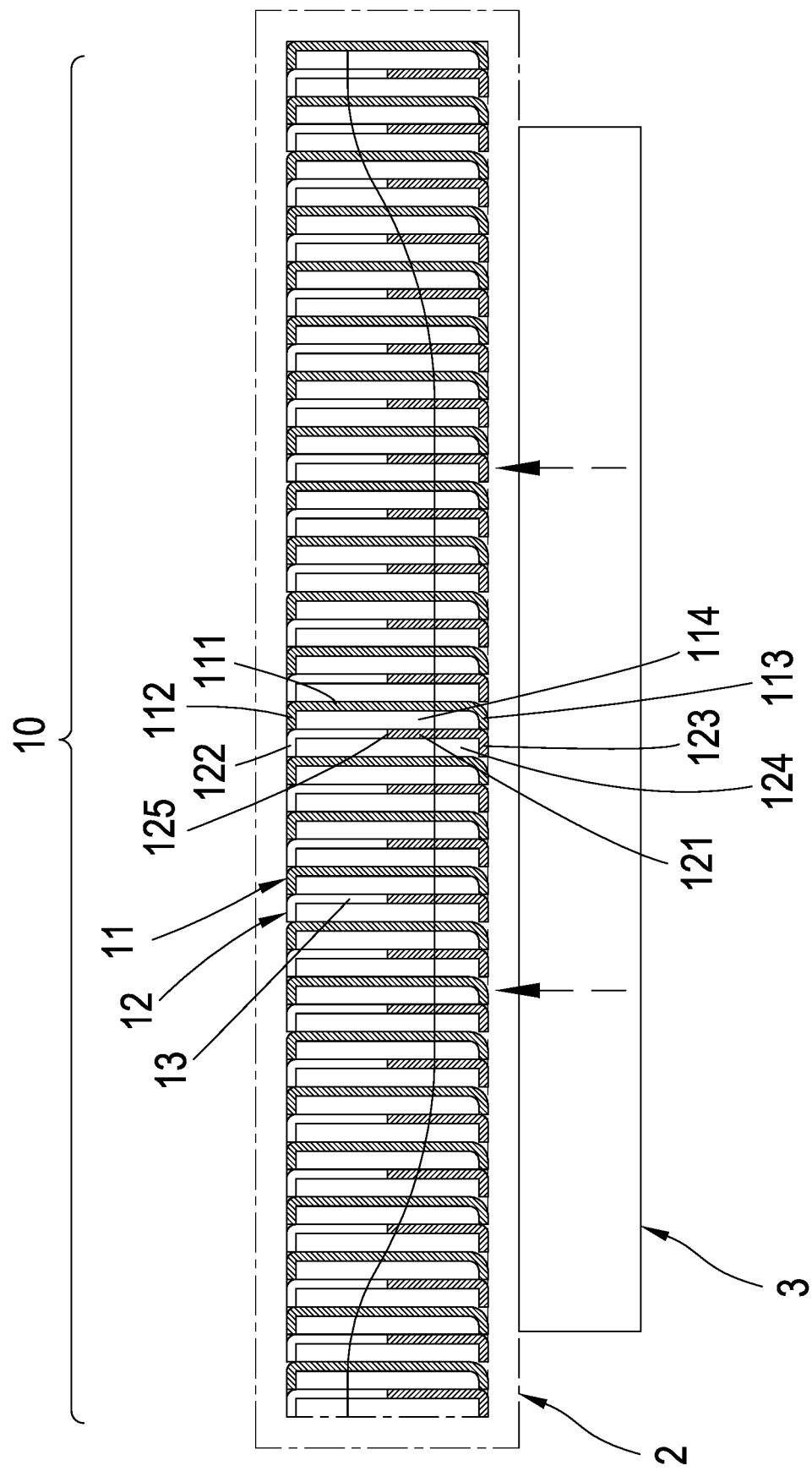
FIG. 7 shows a cross-sectioned view of the heat-sinking module performing heat-sinking operations in the first embodiment of the heat-sinking device according to the present invention.
Figure 8:
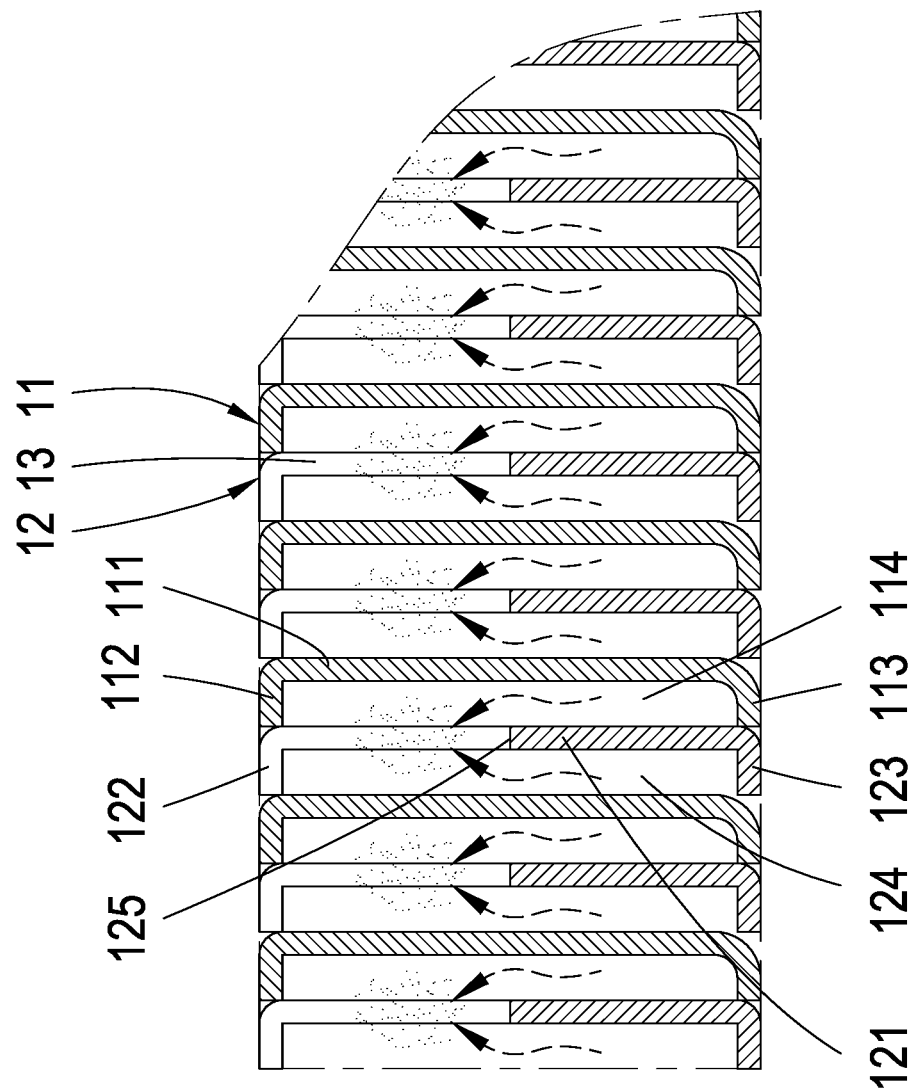
FIG. 8 shows a partial cross-sectioned view of the heat-sinking module performing heat-sinking operations in the first embodiment of the heat-sinking device according to the present invention.

Further referring to FIGS. 2 and 4, it can be appreciated that, in the present embodiment, the outer wall board 11 and the inner wall board 12 are arranged in accordance with a predetermined size ratio, wherein the outer wall board thickness T1 of the outer wall panel 11 is set as a reference (the thicknesses of the first board 111, the second board 112 and the third board 113 are the same, which indicates the outer wall board thickness T1), the inner wall board thickness T2 of the inner wall board 12 is equal to the outer wall board thickness T1 (similarly, the thicknesses of the fourth board 121, the fifth board 122, and the sixth board 123 are the same, which indicates the inner wall board thickness T2); moreover, the evaporation area width T3 of the first evaporation area 114 and the second evaporation area 124 can be 1~5 times of the outer wall board thickness T1, and the total height H1 of the outer wall board 11 may be set as a reference, so that the minimum height H2 at the gap 125 concavely configured on the inner wall board 12 is equal to 0.3~0.7 times (e.g., 0.3, 0.4, 0.5, 0.6, 0.7) of the total height H1.

Figure 9:
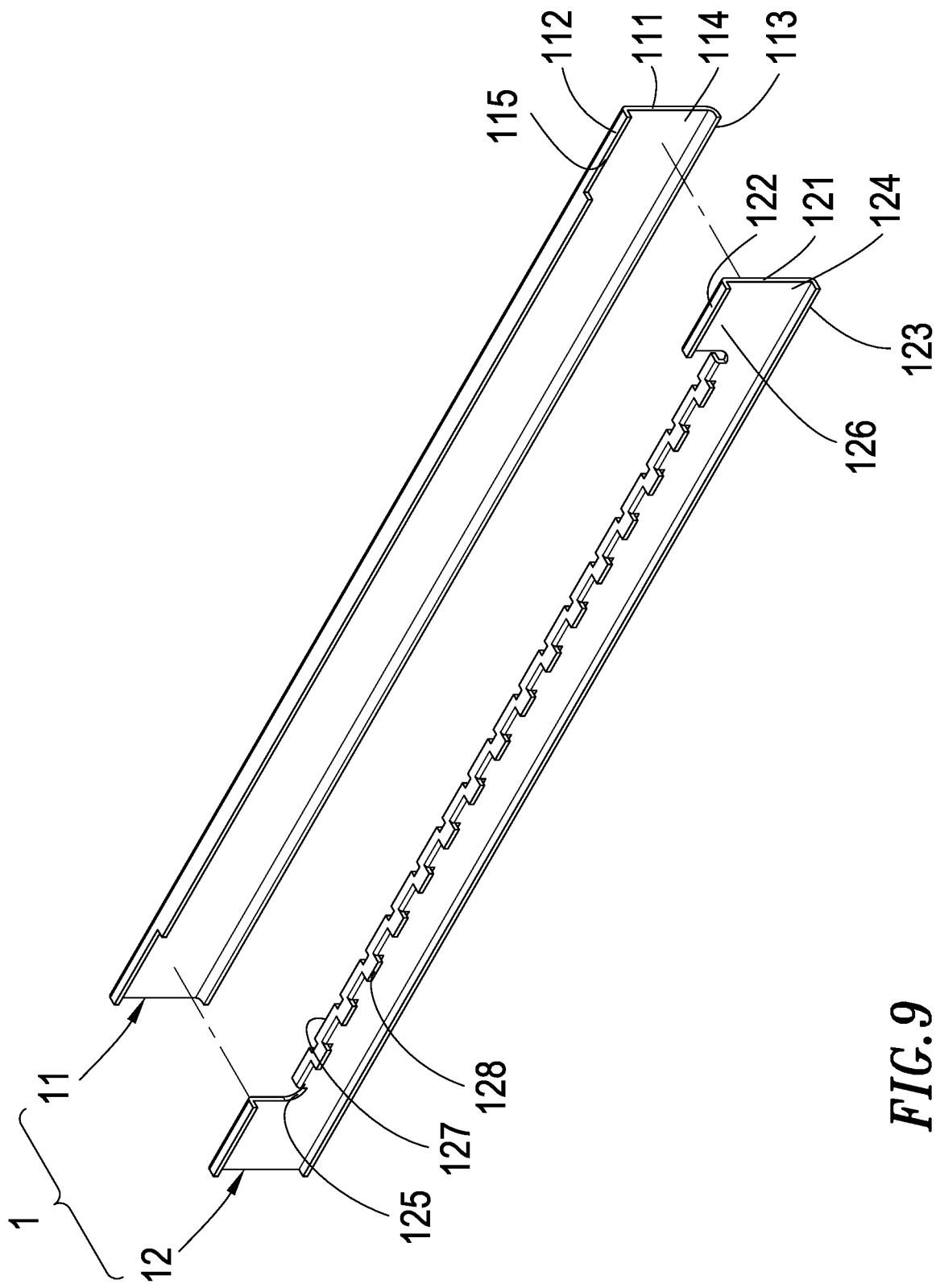
FIG. 9 shows a stereo view of the heat-sinking component in a second embodiment of the heat-sinking device according to the present invention.
Figure 10:
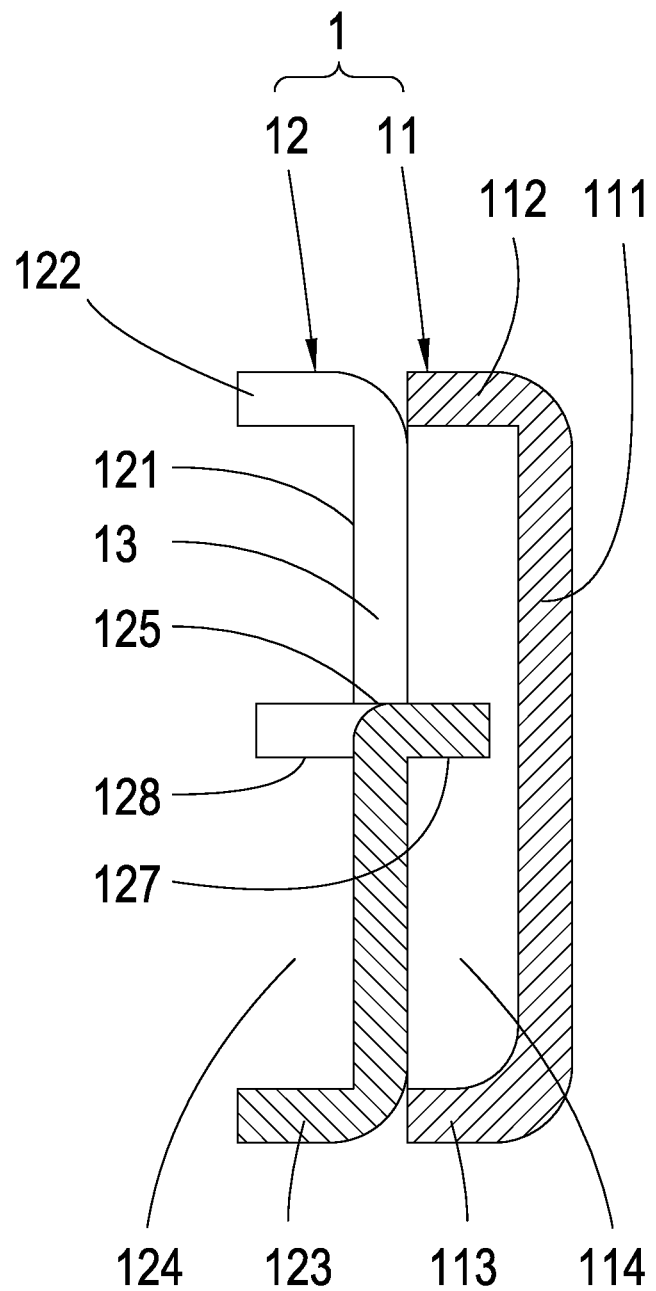
FIG. 10 shows a planar view of the heat-sinking component in the second embodiment of the heat-sinking device according to the present invention.
Figure 11:
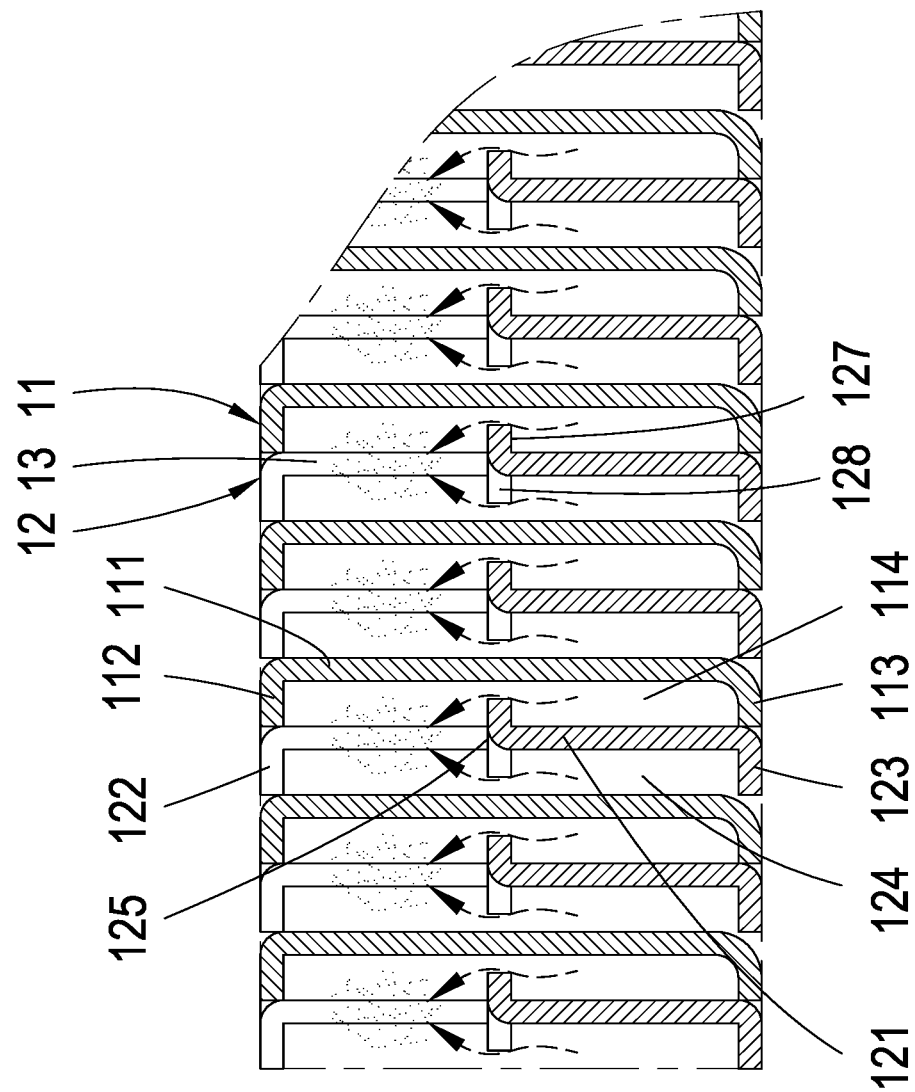
FIG. 11 shows a partial cross-sectioned view of the heat-sinking module performing heat-sinking operations in the second embodiment of the heat-sinking device according to the present invention.

Subsequently, a second embodiment of the fast heat-sinking device for evaporators according to the present invention is shown in FIGS. 9~11, wherein it can be seen that, in the present embodiment, the upper end of the inner wall board 12 concavely configured with the gap 125 is respectively formed with massive amounts of first bumps 127 and second bumps 128, in which the first bumps 127 are formed by extending the top end of the inner wall board 12 towards a lateral side for a preset length, and the second bumps 128 are formed by extending the top end of the inner wall board 12 towards the other lateral side for a preset length; also, each of the first bumps 127 and each of the second bumps 128 are mutually offset such that the top plane of the inner wall board 12 becomes continuously bow-shaped. In this way, the shielding function generated by each of the first bumps 127 and each of the second bumps 128 can effectively increase the air pressure when the water is transformed into gas in the first evaporation area 114 and the second evaporation area 124 thereby making the air flow faster to the air concentration area 13 in order to improve the circulation efficiency.

Figure 12:
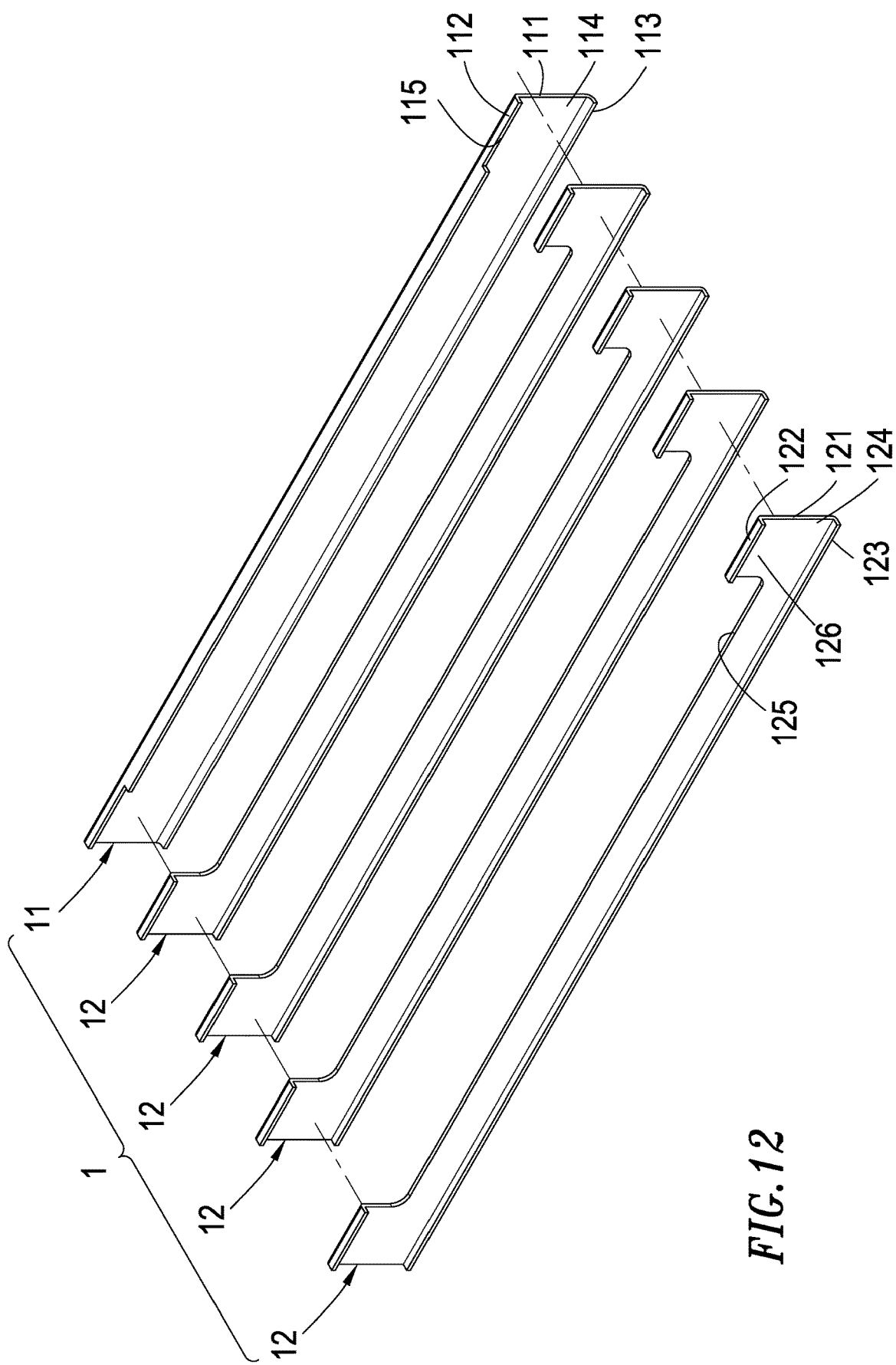
FIG. 12 shows a stereo disassemblage view of the heat-sinking component in a third embodiment of the heat-sinking device according to the present invention.
Figure 13:
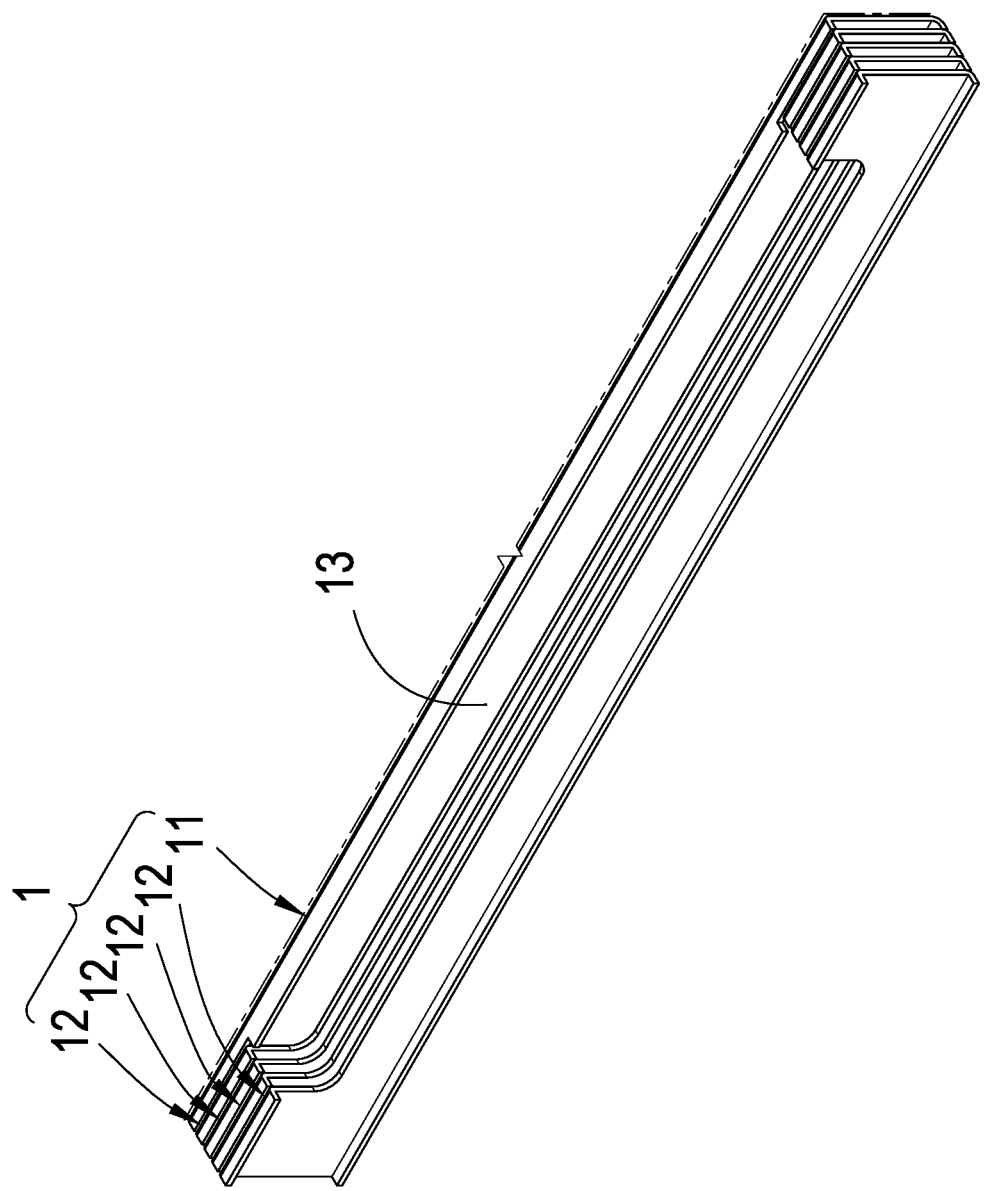
FIG. 13 shows a partial stereo assemblage view of the heat-sinking module in the third embodiment of the heat-sinking device according to the present invention.

Following this, referring to FIGS. 12~13, a third embodiment of the fast heat-sinking device for evaporators according to the present invention is shown, wherein the heat-sinking component 1 is formed by conjunctively assembling an outer wall board 11 and plural inner wall boards 12, and since such plural inner wall boards 12 are continuously attached to the one side of the outer wall board 11, plural gaps 125 allows to accumulate to from greater space for the air concentration area 13.

Figure 14:
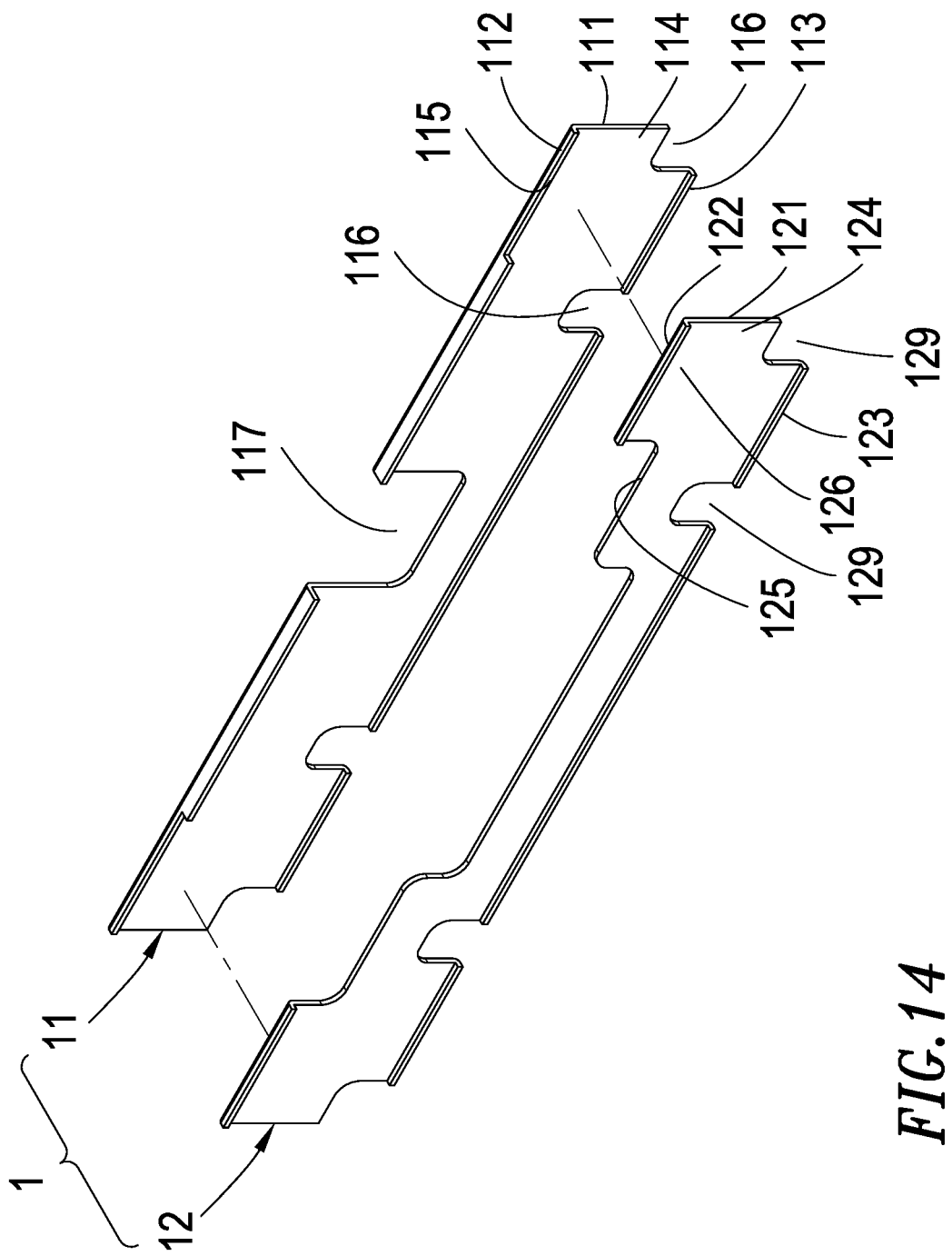
FIG. 14 shows a stereo disassemblage view of the heat-sinking component in a fourth embodiment of the heat-sinking device according to the present invention.
Figure 15:
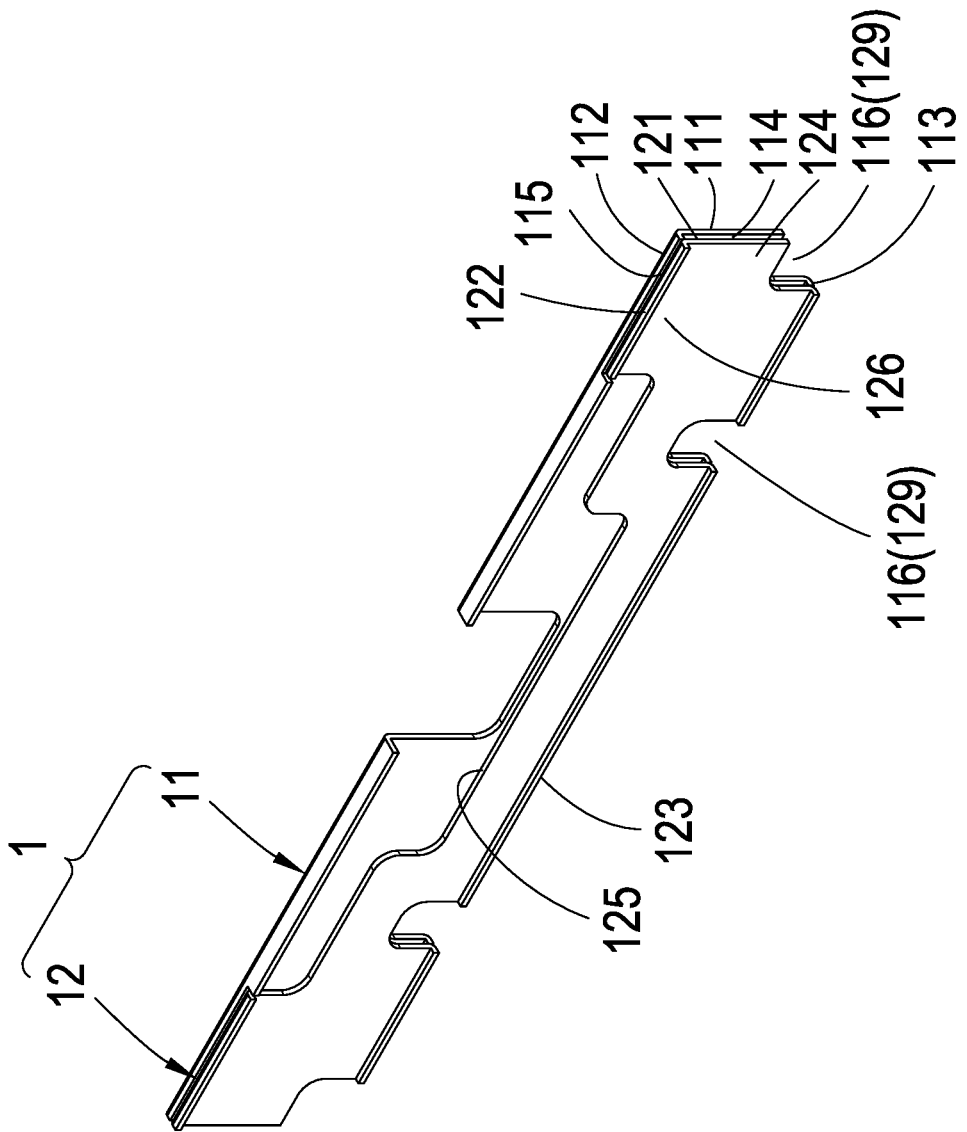
FIG. 15 shows a partial stereo assemblage view of the heat-sinking module in the fourth embodiment of the heat-sinking device according to the present invention.
Figure 16:
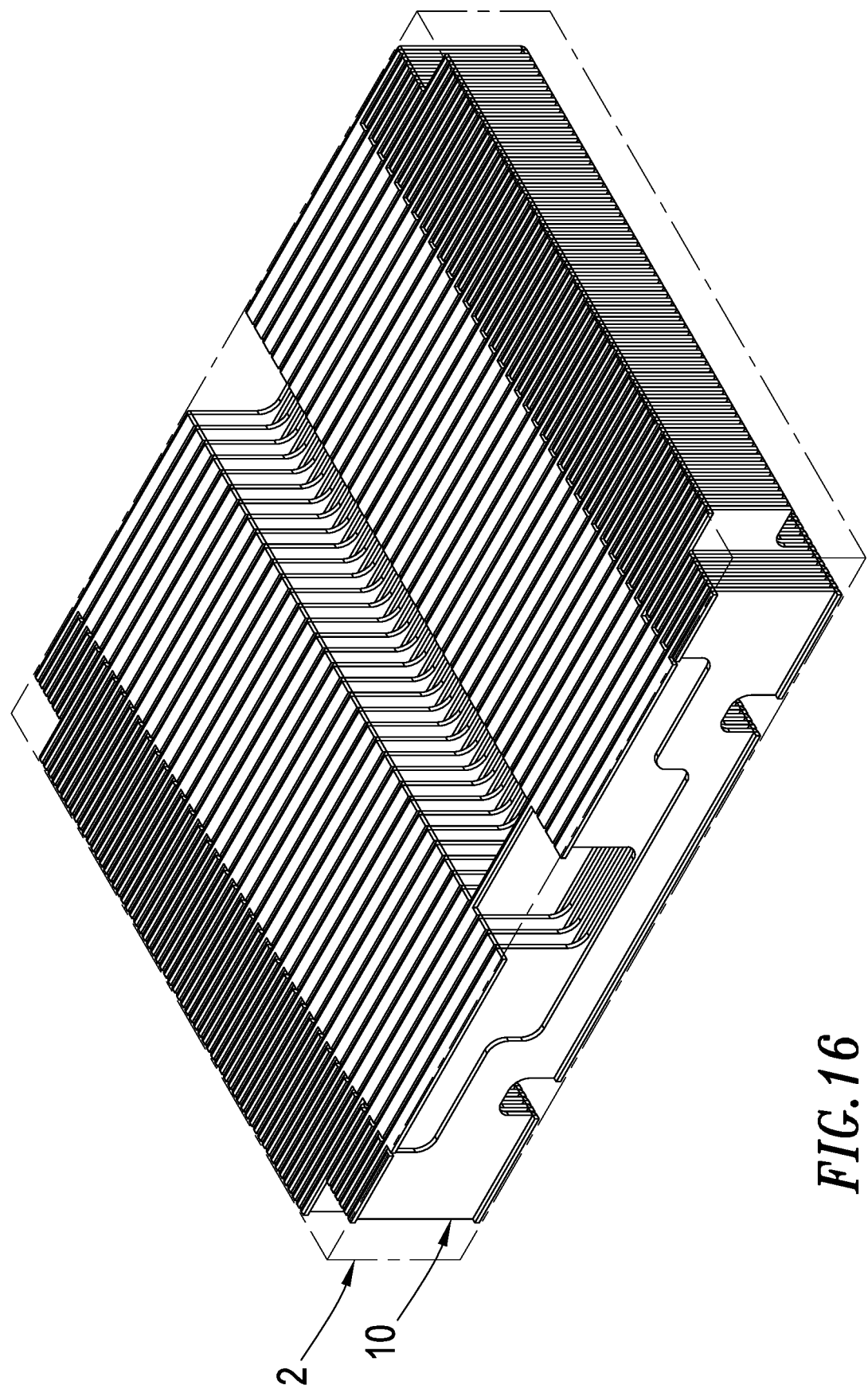
FIG. 16 shows a stereo assemblage view of the heat-sinking module in the fourth embodiment of the heat-sinking device according to the present invention.

In addition, a fourth embodiment of the fast heat-sinking device for evaporators according to the present invention is shown in FIGS. 14~16, wherein the outer wall board 11 is openly configured with one or more first liquid slot 116 on the side neighboring the third board 113 and openly configured with an air slot 117 on the side neighboring the second board 112, and the inner wall board 12 is also openly configured with one or more second liquid slot 129 on the side neighboring the sixth board 123, such that, when the inner wall board 12 and the outer wall board 11 are assembled to form the heat-sinking component 1, each first liquid slot 116 and each second liquid slot 129 can connectively communicate to create a channel enabling liquid circulation, while the air slot 117 and the gap 125 connectively communicate to create a channel enabling air circulation.

Figure 17:
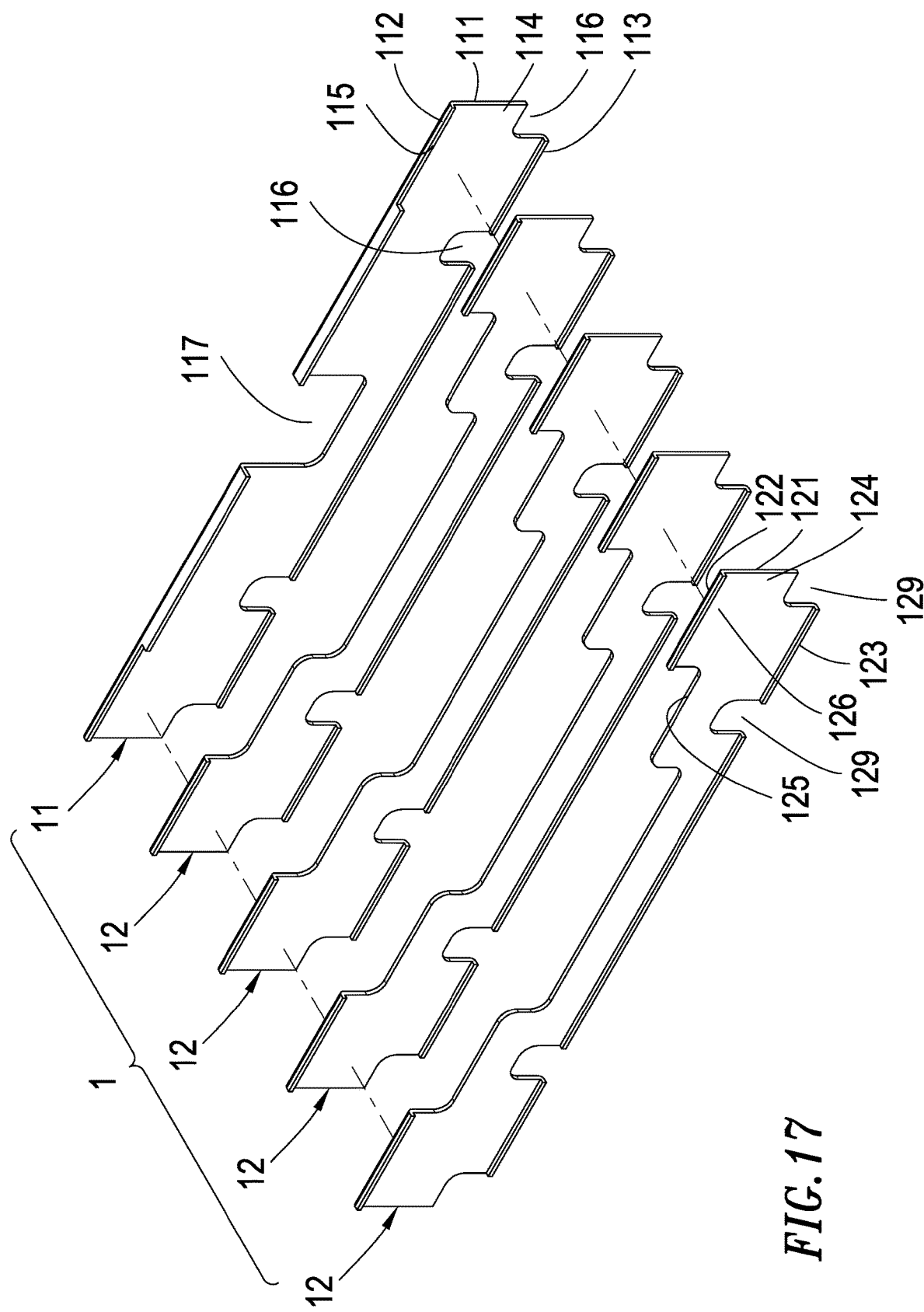
FIG. 17 shows a stereo disassemblage view of the heat-sinking component in a fifth embodiment of the heat-sinking device according to the present invention.
Figure 18:
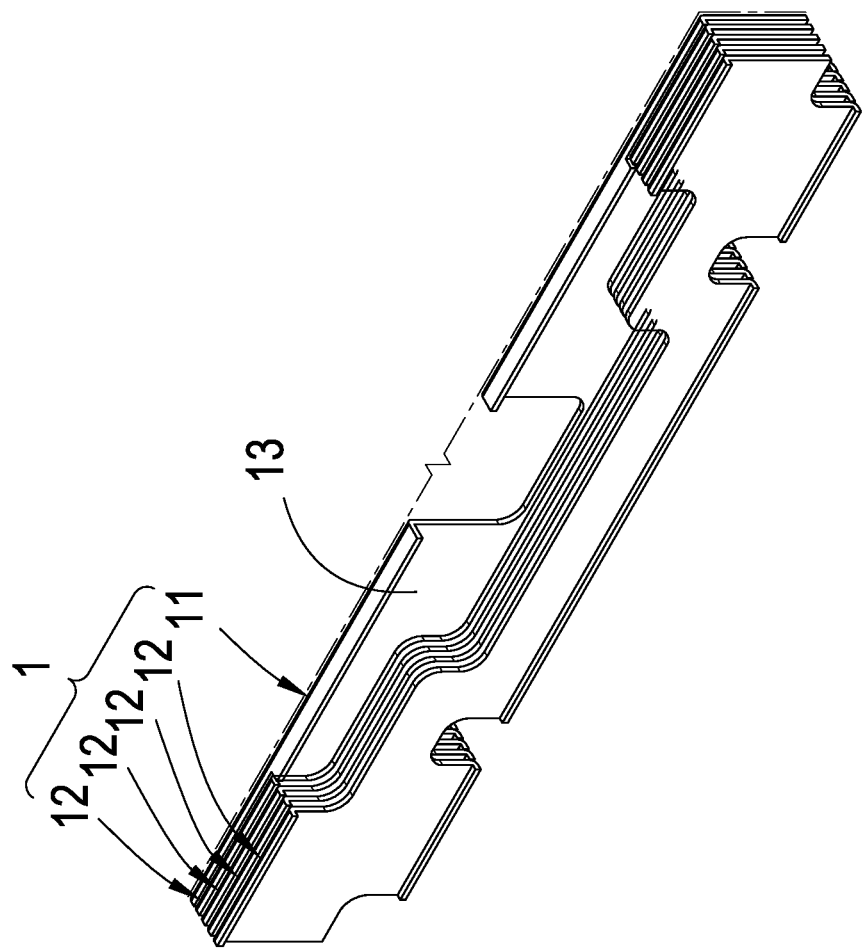
FIG. 18 shows a partial stereo assemblage view of the heat-sinking module in the fifth embodiment of the heat-sinking device according to the present invention.

Moreover, referring to FIGS. 17~18, a fifth embodiment further extending from the base of the aforementioned fourth embodiment of the fast heat-sinking device for evaporators according to the present invention is shown, wherein the heat-sinking component 1 is formed by conjunctively assembling an outer wall board 11 and plural inner wall boards 12, and since such plural inner wall boards 12 are continuously attached to the one side of the outer wall board 11++, plural gaps 125 allows to accumulate to from greater space for the air concentration area 13.

In practical use, there is no specific difference between the above-said third, fourth and fifth embodiments and the first embodiment, so the explanations of their application details are omitted for brevity thereby avoiding redundant descriptions.

Compared with other conventional technologies, the fast heat-sinking device for evaporators according to the present invention provides the following advantages:

1. The heat-sinking components are separately installed into the outer wall board and the inner wall board, so that the heat-sinking module has more water evaporation space and contact area thus allowing the heat energy in the heat-sinking module to be quickly dissipated and enhancing the conduction performance of the heat energy in the heat-sinking module.

2. The water is flow-divided into each of the first or second water evaporation areas, and individual heating can also facilitate faster water evaporation, thereby elevating the performance of evaporation.

3. Initially, the vaporized gaseous water will be concentrated individually in each of the air concentration areas, which tends to generate a large air pressure, such that, when the gas is leaving, it can flow more quickly to the condenser having a smaller pressure, in order to promote the circulation effectiveness of the air and the water.

4. The configuration of the heat-sinking component is divided into the outer wall board and the inner wall board, and such a type of multi-piece assembly can lessen the complexity of the structure itself, thus further reducing the manufacturing difficulty and the incidence of manufacturing defects, which improves convenience and production efficiency of assembly processes and reduces technical costs of mold development operations.

The previously disclosed embodiments are merely illustrative of some preferred ones of the present invention, which are not intended to limit the scope thereof; those who are skilled in the relevant technical fields can, after understanding the technical features and embodiments of the present invention as explained hereinabove, certainly make equivalent changes, alterations or modifications without departing from the spirit and scope of the present invention, which are nonetheless deemed as falling within the coverage of the present invention; accordingly, the scope of the present invention to be protected by patent laws is subject to the definition of the claims attached to this specification.

What is claimed is:

1. A fast heat-sinking device for evaporators, comprising at least one heat-sinking component which is formed by means of conjunctively assembling an outer wall board and an inner wall board;

the outer wall board is separately installed with a first board, a second board and a third board, in which the second board is located on one side of the first board, the positions of two ends of the second board are respectively configured with a notch, the third board is located on the other side of the first board, and preset angles are respectively formed between the second board, the third board and the first board such that a semi-open first evaporation area is formed within the outer wall board, the outer wall board is openly configured with one or more first liquid slots on the side neighboring the third board and openly configured with an air slot on the side neighboring the second board;

the inner wall board is installed with a fourth board, a fifth board and a sixth board, in which the fifth board is located on one side of the fourth board, the sixth board is located on the other side of the fourth board, and preset angles are respectively formed between the fifth the sixth boards and the fourth board such that a semi-open second evaporation area is formed within the inner wall board, and a gap is concavely configured at a middle position of the fifth board along with the fourth board, wherein the gap is larger than the air slot and allows to respectively form a protrusion at the positions of two ends of the fifth board along with the fourth board, and the inner wall board is also openly configured with one or more second liquid slot on the side neighboring the sixth board;

therefore, with each of the protrusions being installed within each notch so as to attach the inner wall board to one side of the outer wall board, and the first evaporation area and the second evaporation area are connected in communication at the gap so as to further together form an air concentration area, each first liquid slot and each second liquid slot connectively communicate to create a channel enabling liquid circulation, while the air slot and the gap connectively communicate to create a channel enabling air circulation; in addition, a plurality of such heat-sinking components are continuously arranged, assembled or integrally manufactured towards the same direction to become a heat-sinking module so as to be installed inside a sealed outer case to act as a heat-sinking structure of an evaporator.

2. The fast heat-sinking device for evaporators according to claim 1, wherein the outer wall board is manufactured by integrally forming or mutually connecting in fixation the first board, the second board and the third board.

3. The fast heat-sinking device for evaporators according to claim 1, wherein the inner wall board is manufactured by integrally forming or mutually connecting in fixation the fourth board, the fifth board and the sixth board.

4. The fast heat-sinking device for evaporators according to claim 1, wherein the outer wall board thickness of the outer wall board is equal to the inner wall board thickness of the inner wall board.

5. The fast heat-sinking device for evaporators according to claim 1, wherein the evaporation area widths of the first evaporation area and the second evaporation area are 1~5 times of the outer wall board thickness of the outer wall board.

6. The fast heat-sinking device for evaporators according to claim 1, wherein the minimum height at the gap concavely configured on the inner wall board is equal to 0.3~0.7 times of the total height of the outer wall board.

* * * * *